United States Patent [19]

Kosugi et al.

[11] Patent Number: 4,479,711
[45] Date of Patent: Oct. 30, 1984

[54] MASK ALIGNER

[75] Inventors: Masao Kosugi, Yokohama; Hiroshi Sato; Kazuo Takahashi, both of Tokyo; Ichiro Ishiyama; Shuichi Yabu, both of Kawasaki, all of Japan

[73] Assignee: Canon Kabushiki Kaisha, Tokyo, Japan

[21] Appl. No.: 446,366

[22] Filed: Dec. 2, 1982

[51] Int. Cl.³ ............................................. G03B 27/52
[52] U.S. Cl. .................................... 355/43; 355/53
[58] Field of Search .............. 355/43, 44, 45, 125, 355/133, 53, 54

[56] References Cited

U.S. PATENT DOCUMENTS 3,844,655  10/1974  Johannsmeier .............. 355/43
4,007,988   2/1977  Bromfield et al. .............. 355/133

*Primary Examiner*—L. T. Hix
*Assistant Examiner*—Brian W. Brown
*Attorney, Agent, or Firm*—Fitzpatrick, Cella, Harper & Scinto

[57] ABSTRACT

In a mask aligner, the actual element pattern of a mask is transferred onto a resist applied to the surface of a wafer, while the alignment pattern of the mask is not transferred onto said resist. That is, the line width of the alignment pattern of the mask is a line width which is not transferred to the wafer. If the pattern of the mask is formed so that the line width of the alignment pattern is thin as compared with that of the actual element pattern, the exposure amount in the alignment pattern portion on the resist applied to the surface of the wafer becomes excessive due to the diffraction phenomenon and thus, the alignment pattern of the mask is not transferred onto the wafer.

4 Claims, 3 Drawing Figures

FIG. I
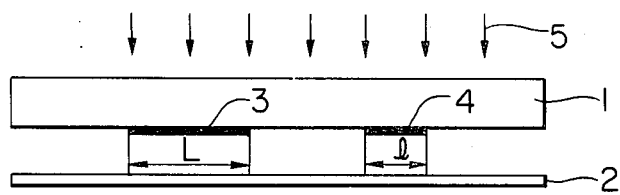
FIG. 2
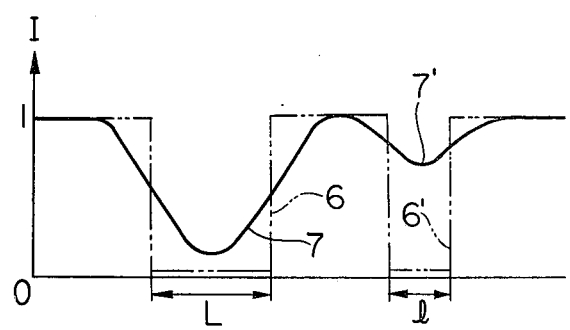
FIG. 3
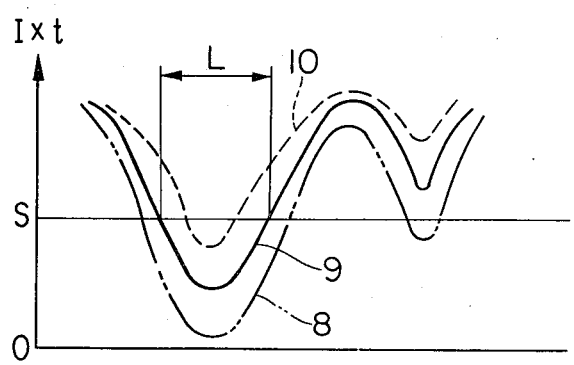

MASK ALIGNER

BACKGROUND OF THE INVENTION

1. Field of the Invention

This invention relates to a mask aligner, namely, a device for aligning, into a predetermined positional relation, a mask which is a negative and a wafer onto which the actual element pattern of the mask is to be printed, and thereafter for transferring the pattern of the mask onto a resist applied to the surface of the wafer.

2. Description of the Prior Art

In aligning a mask and a wafer, providing alignment patterns in opposed relationship on the mask and wafer are usually used particularly in automated alignment (auto-alignment). The alignment patterns on the surface of the mask and the surface of the wafer are provided with their positional accuracy guaranteed relative to actual element patterns such as circuits and, if the mask and wafer are aligned by the use of the alignment patterns, it will mean that they have also been aligned with respect to the actual element patterns. Usually, alignment is carried out with the alignment patterns of the mask and wafer observed at one time through an alignment observation optical system and for this reason, the alignment patterns of the mask and wafer differ in shape from each other.

Heretofore, where alignment has been completed and thereafter exposure has been applied, the actual element pattern of the mask has been transferred to the wafer and simultaneously therewith, the alignment pattern of the mask has been transferred onto the opposed alignment pattern of the wafer. Thus this alignment pattern one the wafer can not be used as the alignment pattern thereafter.

Therefore, a method has heretofore been adopted in which a number alignment patterns as necessary are provided on the wafer and these alignment patterns of the wafer are utilized sequentially during alignment steps.

This method, however, has the following disadvantages. One is that there are a number of alignment patterns and therefore the area that can be occupied by circuit patterns (actual element patterns) is decreased. Another disadvantage is that the mutual positional error of the plurality of alignment patterns reduces the alignment accuracy.

That is, where in the first step, all alignment patterns for use thereafter are made on the wafer, the error between those alignment patterns may cause deterioration of the alignment accuracy during the second and subsequent steps and, where in a certain step, the alignment pattern for use in the next step is made on the wafer, the mutual positional error between the actual element pattern of the mask used in that step and the alignment pattern prepared on the mask for the next step which is to be transferred to the wafer becomes a problem.

For the purpose of overcoming the above-noted disadvantages, means for protecting the alignment pattern on the wafer have been proposed.

One of them, as is known from U.S. Pat. No. 4,007,988, is a method whereby the alignment pattern portion of the wafer or the mask is partly masked when exposure is applied. In this case, the alignment pattern portion of the wafer is not exposed at all.

Another means, as is known from U.S. Pat. No. 3,844,655, is a method whereby excessive exposure is applied only to the alignment pattern portion prior to exposure.

In these two methods, the form differs depending on whether the photosensitive material (resist) is of the positive type or of the negative type, but in any case, as the result of the development, the alignment pattern of the mask is not printed around the alignment pattern of the wafer and, during the subsequent alignment processes, the alignment pattern of that wafer can be reused.

However, of these two methods, the former masking method has the disadvantages that a masking mechanism is required and that time is lost because a masking member is put in and out. The latter pre-exposure method has the disadvantages that a mechanism for applying the excessive exposure is required and that is lost corresponding to the exposure time therefor.

SUMMARY OF THE INVENTION

It is an object of the present invention to eliminate the above-noted disadvantages and to provide a mask aligner in which the number of alignment patterns is limited to minimum and protection of the alignment pattern of a wafer is achieved without using a technique which involves an additional mechanism such as masking or pre-exposure and an attendant time loss (reduced productivity).

This object is achieved by constituting the alignment pattern of a mask by a line width thinner than the visualizing-limit line width $W_0$ (determined by the performance of resist, the performance of a projection optical system, etc. used in the mask aligner) namely, the minimum line width which can be transferred to the wafer.

That is, this object is achieved by providing, in a mask aligner of one-to-one magnification system, an alignment pattern of a line width thinner than the visualizing-limit line width $W_0$, and by providing, in a mask aligner of reduction ratio m, an alignment mark of a line width thinner than $W_0/m$.

The invention will become more fully apparent from the following detailed description thereof taken in conjunction with the accompanying drawings.

BRIEF DESCRIPTION OF THE DRAWINGS

FIG. 1 is a conceptional view showing the manner in which a mask pattern is printed on a wafer.

FIG. 2 is a graph showing the distribution of illumination on the surface of the wafer.

FIG. 3 is a graph showing the changes in the distribution of the amount of exposure with changes in the exposure time.

DESCRIPTION OF THE PREFERRED EMBODIMENT

FIG. 1 illustrates the manner in which the alignment pattern on a mask 1 in a proximity type aligner or a projection type aligner is printed onto a wafer 2. The mask 1 has thereon an actual element pattern 3 having a line width L thicker than the visualizing-limit line width $W_0$ and an alignment pattern 4 having a line width l thinner than the visualizing-limit line width $W_0$, and exposure light 5 is applied thereto. FIG. 2 shows the distribution of illumination I on the surface of the wafer.

As shown in FIG. 2, it is geometro-optically conceivable that a distribution of illumination as indicated at 6, 6' which completely provides a contrast is formed on the surface of the wafer, but in the printing system by the proximity method or the projection method, a distribution of illumination as indicated at 7, 7' is formed under the influence of the diffracted light from a minute pattern. That is, as the line width becomes smaller, the bending of light to the dark portion by diffraction occurs to provide a wave-optic distribution of illumination.

Where the actual element pattern 3 of the mask 1 is to be formed on the wafer 2, it is usual to reproduce a resist image having the same line width as the pattern line width and to this end, the exposure amount is controlled by exposure time t. FIG. 3 shows the distribution of the exposure amount $I \times t$ when the exposure time t has been varied. In FIG. 3, letter S designates the resist sensitivity.

In the distribution of exposure amount denoted at 8 in FIG. 3, the exposure is "under" and in this case, the resist line width is thicker than the line width L of the actual element pattern 3 on the mask. In the distribution of exposure amount denoted at 10, the exposure is "over" and the resist line width is thinner than the line width L of the actual element pattern 3 on the mask.

Accordingly, the distribution of exposure amount denoted at 9 is optimum to print the actual element pattern 3, whereby a resist image of line width L is reproduced.

On the other hand, the alignment pattern 4 of the mask 1 comprises a line width l thinner than the visualizing-limit line width $W_0$, and a resist image corresponding thereto is not formed because an exposure exceeding the resist sensitivity S is provided.

It has been described above with reference to a one-to-one magnification system, namely, the proximity method or the 1:1 projection method, that in the proper exposure amount for the actual element pattern, the alignment pattern is comprised of a line width which is not visualized, and specifically, the line width of the alignment pattern is l relative to the line width L of the actual element pattern. However, even in the projection method of reduction ratio m, the line width of the alignment pattern is determined to be l/m relative to the line width L/m of the actual element pattern, whereby this method can likewise be applied. In the actual use, the line width of the mask pattern must be determined by conditions including the resist characteristic, the performance of the projection optical system, etc., but it will be sufficient if such line width is about ½ of the visualizing-limit line width $W_0$.

In a mask aligner having an observation optical system or a detection optical system for alignment of a mask and a wafer, it is necessary that the line width of the alignment pattern of the mask be a line width which is not transferred to the wafer and be resolvable by the observation or detection optical system.

Also, in the aligner using the present invention, the exposure light may be ultraviolet light, far-ultraviolet light or X-rays or the like.

In the present invention, the alignment pattern of the mask has been described as not being transferred to the wafer, but the present invention can also be applied to such a special usage that a predetermined portion of the actual element pattern of the mask is not to be transferred to the wafer, by making the pattern line width corresponding to said portion thinner than the visualizing-limit line width $W_0$.

If the present invention is used, alignment in all photo processes becomes possible by using a single wafer alignment pattern without adding any additional function and without any time loss, and this is highly advantageous.

We claim:

1. A mask for use with a mask aligner having means for detecting alignment of said mask with a wafer and means for transferring patterns on said mask to the wafer, said detecting means being capable of resolving patterns having line width less than or equal to l, and said transferring means being arranged to be capable of transferring patterns having line width of L and to be incapable of transferring patterns of line width less than or equal to l, where L is greater than l, said mask having:
   an actual element pattern thereon, for transfer by said transferring means to the wafer, said actual element pattern having a minimum line width equal to L, and
   an alignment pattern thereon utilized by said detecting means to align said mask and the wafer, said alignment element pattern having a maximum line width equal to l.

2. A mask aligner for aligning a mask and a wafer, said mask having an actual element pattern thereon having minimum line width L and an alignment pattern thereon having a maximum line width l where L is greater than l, said mask aligner comprising:
   means arranged to be capable of transferring patterns having line width greater than or equal to L to said wafer but to be incapable of transferring patterns having line width less than or equal to l for thereby transferring said actual element pattern of said mask to said wafer; and
   means for observing or detecting the alignment of said mask and said wafer, said observing or detecting means being capable of resolving patterns having line width less than or equal to l;
   wherein said alignment pattern of said mask is a pattern of line width which is not transferred to said wafer by said transferring means when said actual element pattern is transferred to said wafer but which is resolvable by said observing or detecting means.

3. A method of aligning a mask and a wafer and transferring an actual element pattern from the mask to the wafer, comprising the steps of:
   providing a mask with an actual element pattern and an alignment pattern, the alignment pattern having a line width l less than the minimum line width L of the actual element pattern;
   aligning the mask and the wafer using the alignment pattern on the mask;
   providing means for transferring patterns on the mask to the wafer;
   arranging the transferring means to be capable of transferring patterns having line width at least equal to L from the mask to the wafer but to be incapable of transferring patterns having line width less than or equal to l from the mask to the wafer; and
   operating the transferring means, arranged as aforesaid, to transfer the actual element pattern but not the alignment element pattern from the mask to the wafer.

4. A mask alignment apparatus for aligning a mask and a wafer and for transferring an actual element pattern from the mask to the wafer, the mask having an actual element pattern thereon having a minimum line width L and an alignment pattern thereon having a line width l less than L, said apparatus comprising:
  detecting means, capable of resolving patterns having line widths at least equal to l, for detecting alignment of the mask and the wafer using the alignment pattern on the mask; and
  transferring means for transferring patterns from the mask to the wafer, said transferring means being arranged to be capable of transferring patterns of line width at least equal to L and to be incapable of transferring patterns of line width less than or equal to l, whereby the actual element pattern is transferred by said transferring means from the mask to the wafer but the alignment element pattern is not transferred by said transferring means from the mask to the wafer.

* * * * *